(12) United States Patent
Lin et al.

(10) Patent No.: US 11,538,372 B2
(45) Date of Patent: Dec. 27, 2022

(54) DISPLAY DEVICE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chin-Kuan Lin, New Taipei (TW); Che-Chun Su, Taipei (TW); Ju-Ling Cheng, New Taipei (TW); Yu-Kuan Lin, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 102 days.

(21) Appl. No.: 17/140,115

(22) Filed: Jan. 3, 2021

(65) Prior Publication Data

US 2021/0209974 A1 Jul. 8, 2021

Related U.S. Application Data

(60) Provisional application No. 62/957,330, filed on Jan. 6, 2020.

(30) Foreign Application Priority Data

Oct. 12, 2020 (CN) .......................... 202011086940.9

(51) Int. Cl.
G09F 9/302 (2006.01)
G02B 5/02 (2006.01)
H01L 33/60 (2010.01)

(52) U.S. Cl.
CPC ......... *G09F 9/3023* (2013.01); *G02B 5/0242* (2013.01); *H01L 33/60* (2013.01)

(58) Field of Classification Search
CPC ...... G09F 9/3023; G02B 5/0242; H01L 33/60
See application file for complete search history.

(56) References Cited

U.S. PATENT DOCUMENTS 9,767,718 B2 9/2017 Wong et al.
10,107,461 B2 10/2018 Lin et al.
2013/0201426 A1 8/2013 Matsuki et al.

FOREIGN PATENT DOCUMENTS

| CN | 102155681 A | 8/2011 | |
|----|-------------|--------|---|
| CN | 104321694 A * | 1/2015 | ........... G02B 6/0068 |
| CN | 106328008 A | 1/2017 | |
| CN | 107403791 A | 11/2017 | |

(Continued)

*Primary Examiner* — Mary Ellen Bowman
(74) *Attorney, Agent, or Firm* — Li & Cai Intellectual Property Office

(57) ABSTRACT

A display device is provided. The display device includes a circuit board, a reflective housing, a plurality of light emitting diode units, and a diffusion film The reflective housing is disposed on the circuit board and has a plurality of recesses. The light emitting diode units are disposed in the recesses and are electrically connected to the circuit board. The diffusion film is disposed on the reflective housing and covers the recesses. The diffusion film includes a plurality of ink spots that are spaced apart from each other, and the ink spots correspond in position to the recesses.

16 Claims, 10 Drawing Sheets

(56) References Cited

FOREIGN PATENT DOCUMENTS

| | | | |
|---|---|---|---|
| CN | 108205170 | A | 6/2018 |
| EP | 1566687 | A1 | 8/2005 |
| JP | 201438757 | A | 2/2014 |

* cited by examiner

DISPLAY DEVICE

CROSS-REFERENCE TO RELATED PATENT APPLICATION

This application claims priority to the U.S. Provisional Patent Application Ser. No. 62/957,330, filed on Jan. 6, 2020, which application is incorporated herein by reference in its entirety.

This application claims the benefit of priority to China Patent Application No. 202011086940.9, filed on Oct. 12, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display device, and more particularly to a display device having better light uniformity.

BACKGROUND OF THE DISCLOSURE

A conventional display device includes a circuit board, a housing having a plurality of recesses, a plurality of light emitting elements, and a transmissive plate. The housing having the recesses is disposed on the circuit board. The light emitting elements spaced apart from each other are disposed in each of the recesses and are electrically connected to the circuit board. The transmissive plate covers the recesses. Therefore, the conventional display device can generate a specific light pattern on the transmitting plate through the cooperation of the light emitting elements and the recesses. For example, when the recesses are in a circular-shaped arrangement, the light generated by the light emitting elements can form a light pattern being in a circular shape through the circular-shaped arrangement of the recesses.

However, in order to ensure that the light pattern formed by the light emitting elements and the recesses is uniform and clear, that is, the light pattern does not have apparently uneven light distribution, the conventional display device will increase the quantity of light emitting elements in each of the recesses so as to well-control the distance that is between any two of the light emitting elements adjacent to each other, and thus the uneven light distribution of the light pattern can be prevented. Therefore, this method causes the conventional display device to have a higher cost.

SUMMARY OF THE DISCLOSURE

In response to the above-referenced technical inadequacies, the present disclosure provides a display device to effectively improve on the issues associated with the conventional display devices.

In one aspect, the present disclosure provides a display device. The display device includes a circuit board, a reflective housing, a plurality of light emitting diode units, and a diffusion film. The reflective housing is disposed on the circuit board and has a plurality of recesses. The light emitting diode units are disposed in the recesses and are electrically connected to the circuit board. The diffusion film is disposed on the reflective housing and covers the recesses. The diffusion film includes a plurality of ink spots that are spaced apart from each other, and the ink spots correspond in position to the recesses.

In certain embodiments, the diffusion film further includes a base layer, a pattern layer, an ink layer, and an adhesive layer. The pattern layer is disposed on the base layer. The pattern layer has a plurality of predetermined pattern regions that allow light to pass therethrough. The predetermined pattern regions respectively correspond in position to the recesses. The ink layer is disposed on the base layer and has the ink spots, and the ink spots respectively correspond in position to the predetermined pattern regions. The adhesive layer is disposed on the pattern layer. The adhesive layer is configured to fix the diffusion film on the reflective housing.

In certain embodiments, the pattern layer further includes a shading region, and the shading region surrounds and forms the predetermined pattern regions.

In certain embodiments, the base layer includes a transmissive substrate and a diffusion coating layer that is disposed on the transmissive substrate. The diffusion coating layer corresponds in position to the recesses.

In certain embodiments, the base layer is a diffusive substrate.

In certain embodiments, a color of each of the ink spots is white.

In certain embodiments, each of a plurality of projection regions defined by orthogonally projecting any one of the light emitting diode units onto the diffusion film is defined as a first region, and the diffusion film defines a plurality of second regions that respectively surround any one of the first regions. The ink spots are respectively located at the first regions and the second regions, and a bottom area of each of the ink spots located in any one of the first regions is greater than a bottom area of each of the ink spots located in any one of the second regions. Any two of the ink spots adjacent to each other are equidistantly spaced apart from each other.

In certain embodiments, in any one of the first regions, a total area of the bottom areas of the ink spots covers a range from 50% to 80% of an area of the first region. In any one of the second regions, a total area of the bottom areas of the ink spots covers a range from 20% to 50% of an area of the second region.

In certain embodiments, in each of the recesses, a difference between a transmittance in the first region and a transmittance in the second region is within a range from 27% to 32%.

In certain embodiments, each of a plurality of projection regions defined by orthogonally projecting any one of the light emitting diode units onto the diffusion film is defined as a first region, and the diffusion film defines as a plurality of second regions that respectively surround any one of the first regions. The ink spots are respectively located at the first regions and the second regions, and a distance between any two of the ink spots in the second region is greater than a distance between any two of the ink spots in the first region. Any two of bottom areas of the ink spots are equal.

In certain embodiments, in any one of the first regions, a total area of the bottom areas of the ink spots covers a range from 50% to 80% of an area of the first region. In any one of the second regions, a total area of the bottom areas of the ink spots covers a range from 20% to 50% of an area of the second region.

In certain embodiments, in each of the recesses, a difference between a transmittance in the first region and a transmittance in the second region each are within a range from 27% to 32%.

In certain embodiments, each of the ink spots is in a shape of a dot.

In certain embodiments, each of a plurality of projection regions defined by orthogonally projecting any one of the light emitting diode units onto the diffusion film is defined as a first region. The diffusion film defines a plurality of second regions respectively surrounding any one of the first regions, a plurality of third regions respectively surrounding any one of the second regions, and a plurality of fourth regions that respectively surround any one of the third regions. A bottom area of each of the ink spots located in the first regions is greater than a bottom area of each of the ink spots located in the second regions, the bottom area of each of the ink spots located in the second regions is greater than a bottom area of each of the ink spots located in the third regions, and the bottom area of each of the ink spots located in the third regions is greater than a bottom area of each of the ink spots located in the fourth regions.

In certain embodiments, in any one of the first regions, a total area of the bottom areas of the ink spots covers a range from 60% to 80% of an area of the first region. In any one of the second regions, a total area of the bottom areas of the ink spots covers a range from 40% to 60% of an area of the second region. In any one of the third regions, a total area of the bottom areas of the ink spots covers a range from 20% to 40% of an area of the third region. In any one of the fourth regions, a total area of the bottom areas of the ink spots covers a range from 0% to 20% of an area of the fourth region.

Therefore, by virtue of "the light generated by the light emitting diode units disposed in each of the recesses can be scattered through passing the ink spots of the diffusion film, so that the difference in transmittance between the light passing through the first region and the light passing through the second region is reduced", the light pattern of the display device in the present disclosure is formed by the light emitting diode units being disposed in each of the recesses on the diffusion film and can prevent uneven light distribution.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
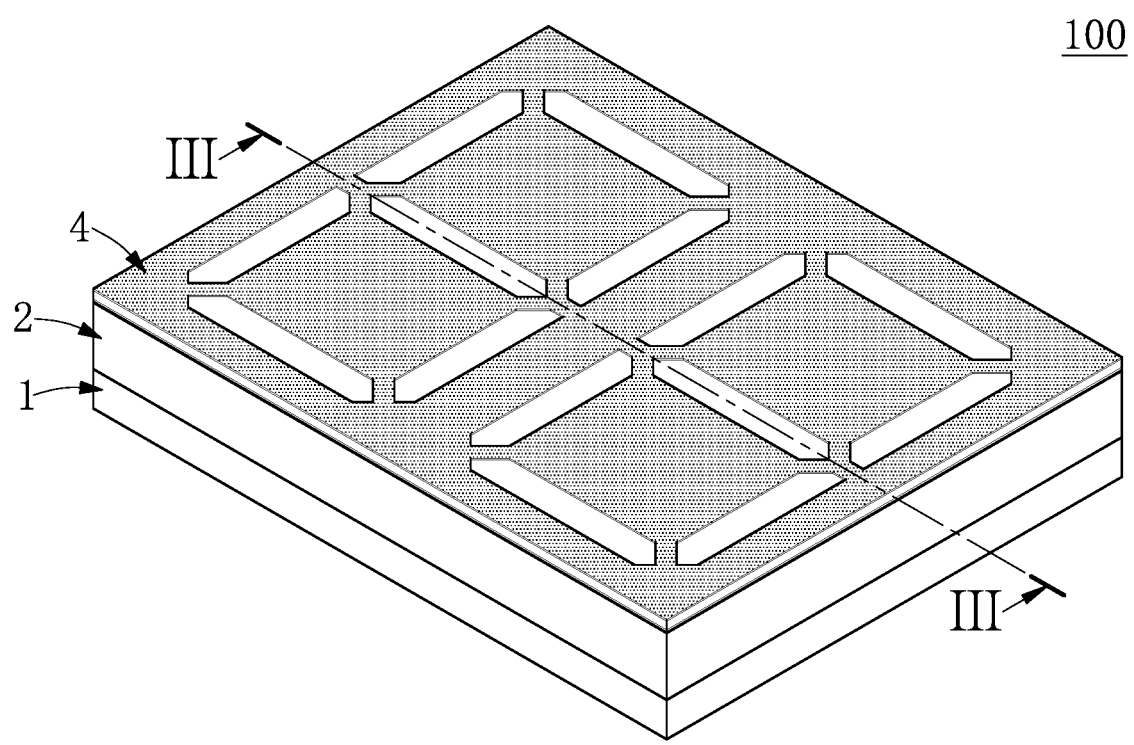
FIG. 1 is a schematic perspective view of a display device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a display device 100. The display device 100 includes a circuit board 1, a reflective housing 2 disposed on the circuit board 1, a plurality of light emitting diode units 3 accommodated in the reflective housing 2, and a diffusion film 4 covering the reflective housing 2. The display device 100 can generate a light pattern through the light generated by the light emitting diode units 3, in association with the reflective housing 2 and the diffusion film 4. The light pattern in the present embodiment is a pattern that is in a shape of two Arabic numerals "8". The following description describes the structure and connection relation of each component of the display device 100.

Figure 2:
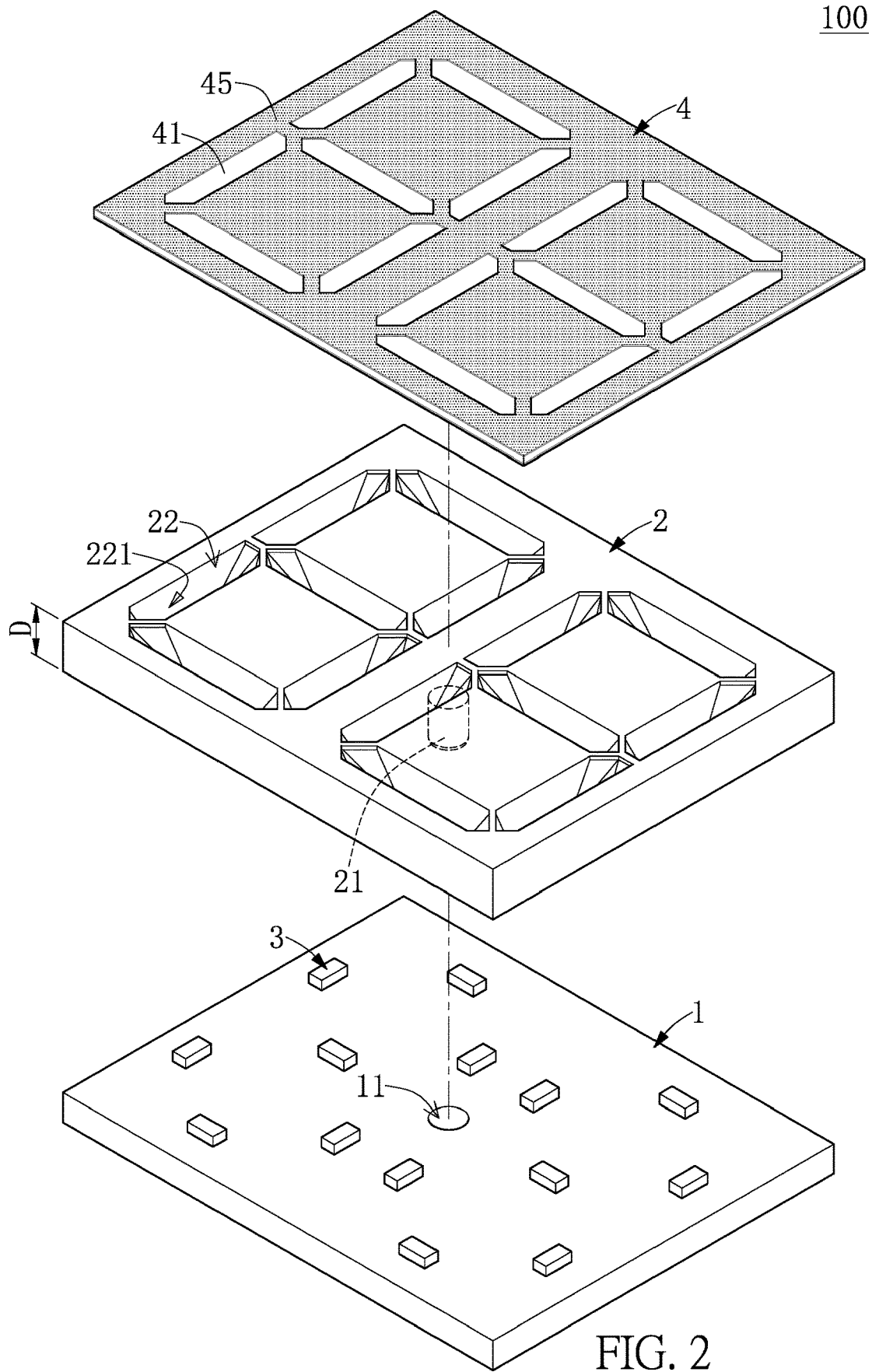
FIG. 2 is a schematic exploded view of the display device according to the first embodiment of the present disclosure.
Figure 3:
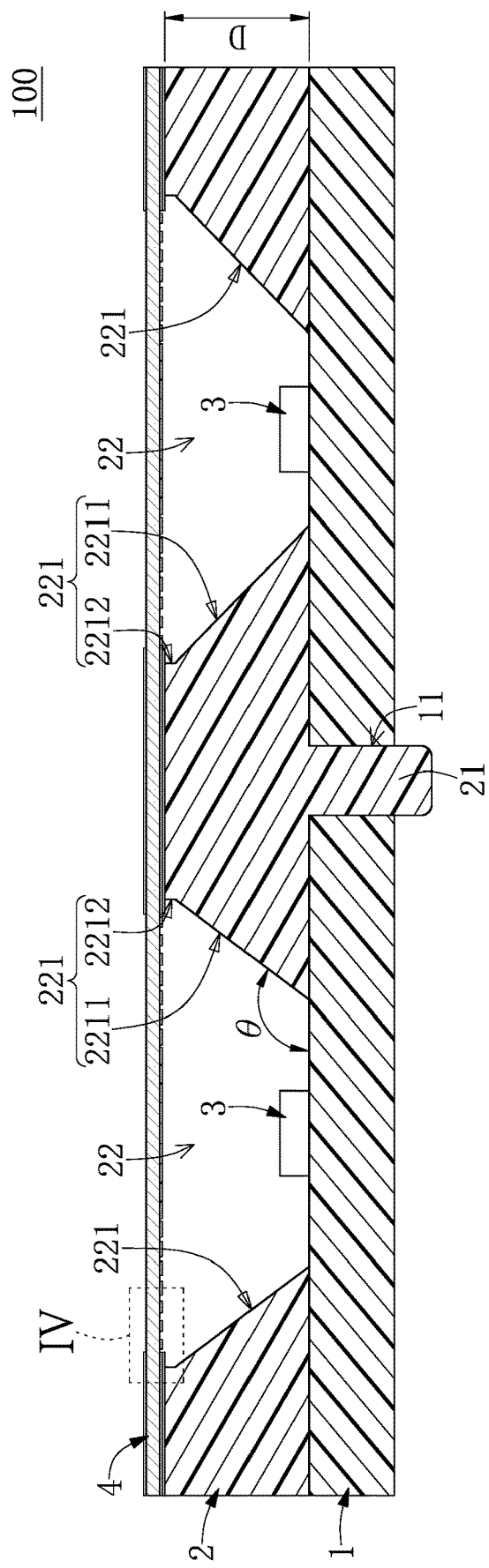
FIG. 3 is a cross-sectional view taken along line III-III of FIG. 1.

Referring to FIG. 1 to FIG. 3, the circuit board 1 in the present embodiment is a printed circuit board (i.e., a PCB board) and has a fixing hole 11. The reflective housing 2 covers the circuit board 1. More specifically, the reflective housing 2 in the present embodiment has a fixing rod 21, and the reflective housing 2 is fixed on the circuit board 1 through engaging with the fixing rod 21 and the fixing hole 11.

In addition, the reflective housing 2 is made of a material that can reflect light. A size of the reflective housing 2 matches a size of the circuit board 1, but the present disclosure is not limited thereto. For example, in another embodiment of the present disclosure that is not shown, the size of the reflective housing 2 can also be greater than the size of the circuit board 1, or the reflective housing 2 can enclose the circuit board 1.

The reflective housing 2 has a plurality of recesses 22, and each of the recesses 22 in the present embodiment is substantially in a shape of an elongated hexagon. Each of the recesses 22 can accommodate at least one of the light emitting diode units 3, and the light generated by the light emitting diode units 3 in any one of the recesses 22 cannot penetrate to another one of the recesses 22. A side of each of the recesses 22 in the present embodiment is in spatial communication with the circuit board 1. In other words, the circuit board 1 is used to seal a bottom portion for each of the recesses 22, but the present disclosure is not limited thereto.

Further, referring to FIG. 3, the cross-sectional view of a direction along a thickness D of the reflective housing 2 is shown, each of the recesses 22 has two reflective walls 221 that are opposite to each other. In any one of the recesses 22, each of the two reflective walls 221 has an oblique segment 2211 and a straight segment 2212 that connects the oblique segment 2211 together, the oblique segment 2211 and a bottom surface of the recess 22 have an angle θ there-between, and the angle θ is within a range from 127 degrees to 136 degrees. In any one of the recesses 22, each of the straight segments 2212 is located adjacent to an opening position of the recess 22, and each of the straight segments 2212 is substantially perpendicular to the bottom surface of the recess 22 (i.e., the circuit board 1). In any one of the recesses 22, the light generated by the light emitting diode units 3 can reflect the light through the two reflective walls 221 so as to improve the luminous efficacy. In addition, in each of the recesses 22, the bottom surface of the recess 22 and a top surface of the reflective housing 2 have a shortest distance there-between, and the shortest distance is preferably less than 2.5 millimeters (mm), that is, the thickness D of the reflective housing 2 is preferably less than 2.5 millimeters (mm)

The light emitting diode units 3 are disposed in the recesses 22 and are electrically connected to the circuit board 1, and the circuit board 1 can control the light emitting diode units 3 to emit the light. Furthermore, each of the recesses 22 has one of the light emitting diode units 3 disposed therein in the present embodiment, and each one of the light emitting diode units 3 is located at a center position of one of the recesses 22 corresponding thereto.

Figure 4:
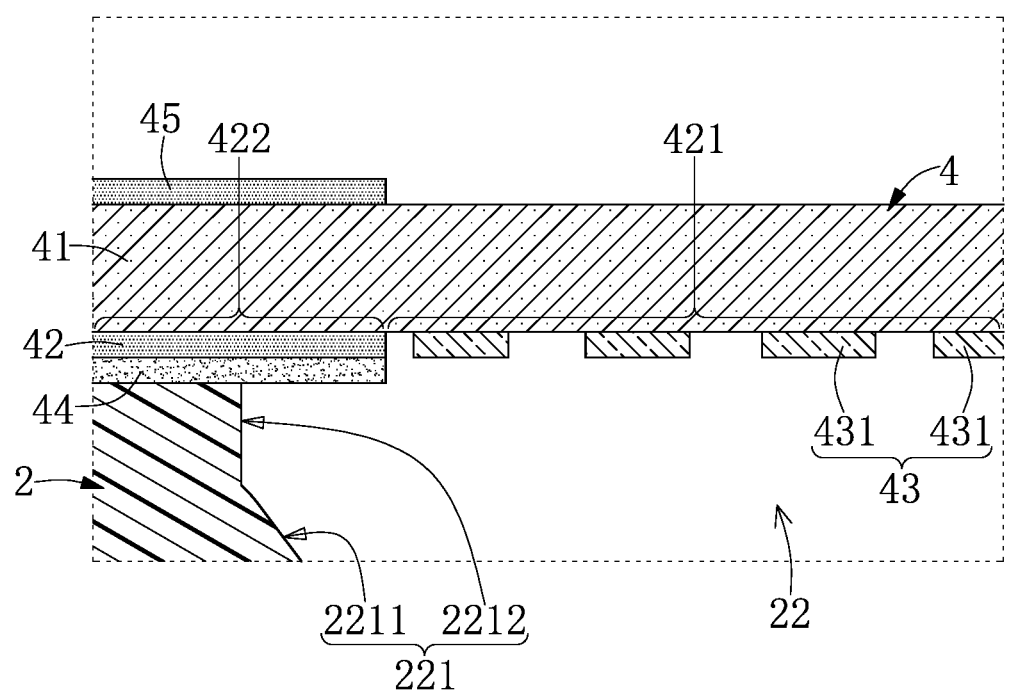
FIG. 4 shows an enlarged view of part IV of FIG. 3.
Figure 5:
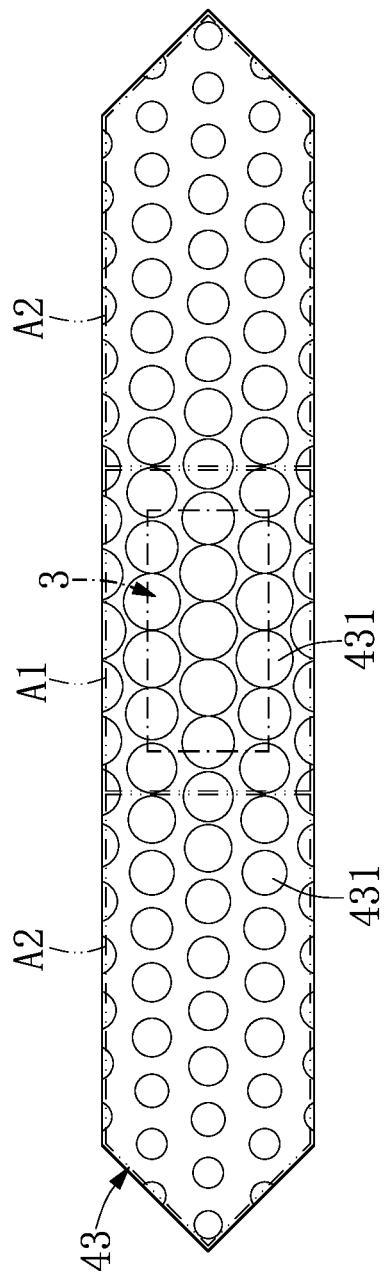
FIG. 5 is a schematic top view of a diffusion film of the display device according to the first embodiment of the present disclosure.

Referring to FIG. 3 to FIG. 5, the diffusion film 4 is disposed on the reflective housing 2, and the diffusion film 4 covers the recesses 22 and is parallel to a top surface of the light emitting diode units 3. In other words, each of the recesses 22 in the present embodiment is not filled with resin, so that the light generated by the light emitting diode units 3 can directly pass through the diffusion film 4.

Referring to FIG. 3 and FIG. 4, the diffusion film 4 is arranged on a side surface of the reflective housing 2 away from the circuit board 1, and the diffusion film 4 is a multilayer structure so as to include a base layer 41, a pattern layer 42, an ink layer 43, and an adhesive layer 44.

The base layer 41 in the present embodiment is a diffusive substrate, that is, the base layer 41 includes diffusion particles, and the light transmittance of the base layer 41 is preferably within a range from 20% to 80%. The pattern layer 42 is disposed on a side surface of the base layer 41 facing the reflective housing 2, and the pattern layer 42 has a plurality of predetermined pattern regions 421 and a shading region 422. The predetermined pattern regions 421 correspond in position to the recesses 22, and the shading region 422 surrounds the predetermined pattern regions 421. The shading region 422 in the present embodiment is coated with a light-shielding ink, so that only light from the plurality of light emitting diode units 3 can pass through the predetermined pattern regions 421. In other words, the shading region 422 is designed according to a desired shape of the light pattern, so that the shading region 422 can shield the light generated by the light emitting diode units 3 to achieve the purpose of adjusting the shape of the light pattern.

The ink layer 43 is disposed on a surface of the base layer 41 facing the reflective housing 2 and is arranged in the predetermined pattern regions 421. In detail, the ink layer 43 includes a resin matrix and a plurality of diffusion particles, a weight percentage concentration of the diffusion particles of the ink layer 43 is higher than a weight percentage concentration of the diffusion particles of the base layer 41, and the weight percent concentration of the diffusion particles of the ink layer 43 is preferably within a range from 20% to 80%. The ink layer 43 is distributed in dots as shown in FIG. 5. The ink layer 43 has a plurality of ink spots 431, the ink spots 431 comprises, for example, white diffusive pigment, so that each of the ink spots 431 is white and in a shape of a dot, but the present disclosure is not limited thereto. For example, the ink spots 431 may be in other shapes, or may also be in colors other than white by using other diffusive particles that have different colors.

The adhesive layer 44 is disposed on the shading region 422 of the pattern layer 42, and the adhesive layer 44 is disposed on the side surface of the reflective housing 2 away from the circuit board 1, so that the diffusion film 4 is fixed on the reflective housing 2.

In addition, the diffusion film 4 in the present embodiment further has an outer pattern layer 45 disposed on a surface of the base layer 41 away from the reflective housing 2, and the outer pattern layer 45 is made from opaque paint. The outer pattern layer 45 corresponds in position to the shading region 422 of the pattern layer 42 so as to assist in shielding of the light generated by the light emitting diode units 3.

Furthermore, referring to FIG. 5, a projection region of any one of the light emitting diode units 3 orthogonally projecting onto the diffusion film 4 is defined as one of a plurality of first regions A1, and the diffusion film 4 defines as a plurality of second regions A2 that respectively surround any one of the first regions A1. The ink spots 431 are respectively located at the first regions A1 and the second regions A2, and a bottom area of each of the ink spots 431 located in any one of the first regions A1 is greater than a bottom area of each of the ink spots located in any one of the second regions A2. Moreover, any two of the ink spots 431 adjacent to each other are equidistantly spaced apart from each other by a distance.

More specifically, in each of the recesses 22, the bottom area of each of the ink spots 431 on the diffusion film 4 gradually decreases from a center position of the first region A1 toward the second region A2, but the present disclosure is not limited thereto. For example, in each of the recesses 22, any two of the bottom areas of the ink spots 431 in the first region A1 and any two of the bottom areas of the ink spots 431 in the second region A2 can have the same size, but the bottom area of each of the ink spots 431 in the first region A1 is greater than the bottom area of each of the ink spots 431 in the second region A2.

As mentioned above, in any one of the first regions A1, a total area of the bottom areas of the ink spots 431 covers a range from 50% to 80% of an area of the first region A1. In any one of the second regions A2, a total area of the bottom areas of the ink spots 431 covers a range from 20% to 50% of an area of the second region A2. Therefore, in any one of the recesses 22, a difference between a transmittance in the first region A1 and a transmittance in the second region A2 is within a range from 27% to 32% so as to reduce a difference between a luminous flux of the light generated by the light emitting diode units 3 in the first region A1 and a luminous flux of light generated by the light emitting diode units 3 in the second region A2 to obtain better light uniformity. In addition, Table 1 shows an experimental data of the display device 100 of the present disclosure obtained through the above-mentioned structure, and referring to FIG. 5 at the same time, the quantity of each of the measurement positions in Table 1 represents the distance from the position of one of the light emitting diode units 3. In other words, when the quantity of the measurement position is equal to 0, the quantity of the measurement position represents the brightness in the first region A1 located in any one of the recesses 22. When the quantity of the measurement position is equal to −1 or 1, the quantity of the measurement position represents the brightness in the second region A2 located in any one of the recesses 22.

TABLE 1

|  | Present embodiment | | | Conventional technology | | |
|---|---|---|---|---|---|---|
| Measurement position | −1 | 0 | 1 | −1 | 0 | 1 |
| Brightness (cd/m$^2$) | 192 | 290 | 129 | 249 | 433 | 133 |
| Light uniformity | | 44.6% | | | 30% | |

Second Embodiment

Figure 6:
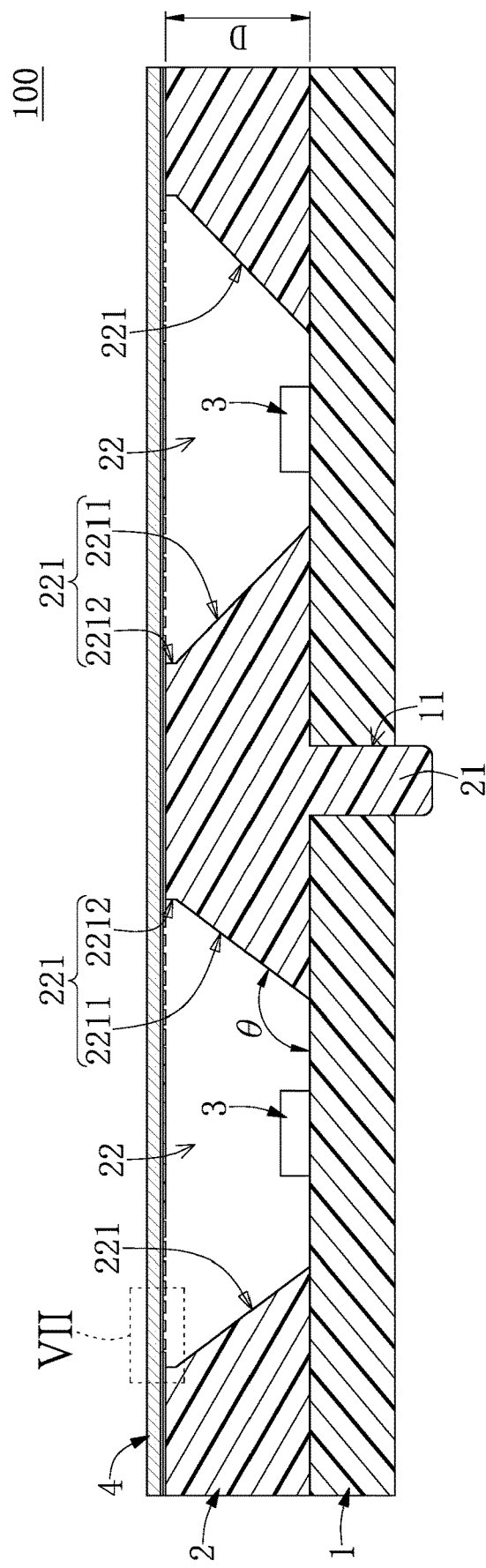
FIG. 6 is a cross-sectional schematic view of a display device according to a second embodiment of the present disclosure.
Figure 7:
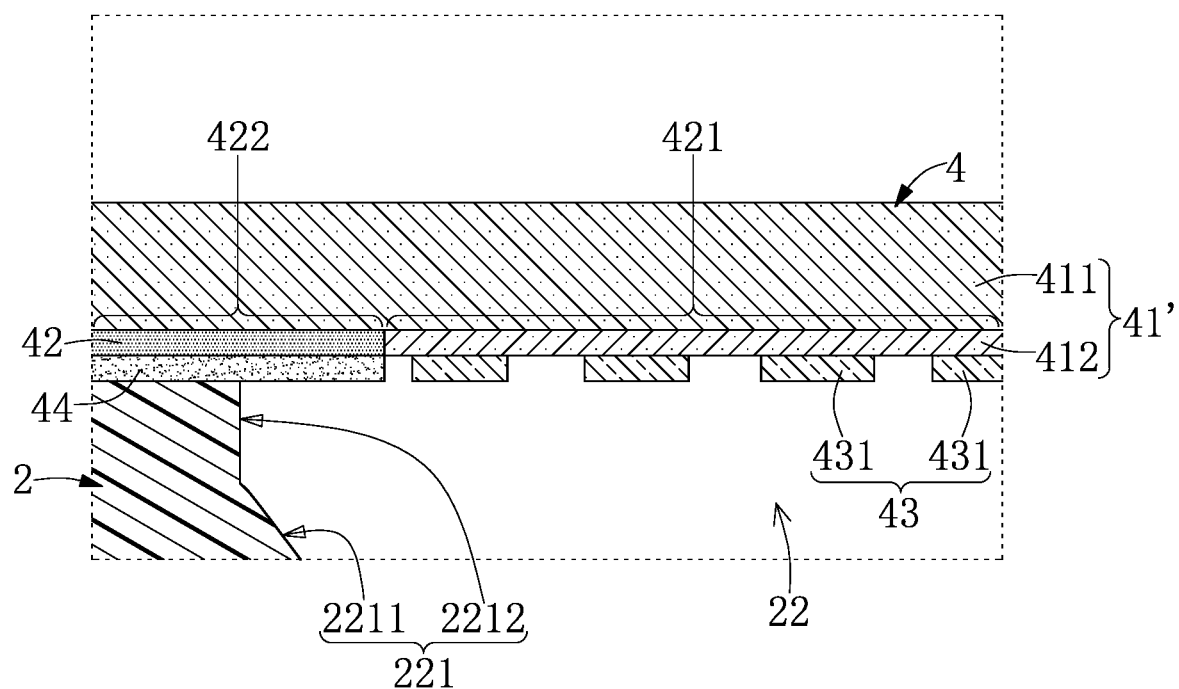
FIG. 7 shows an enlarged view of part VII of FIG. 6.
Figure 8:
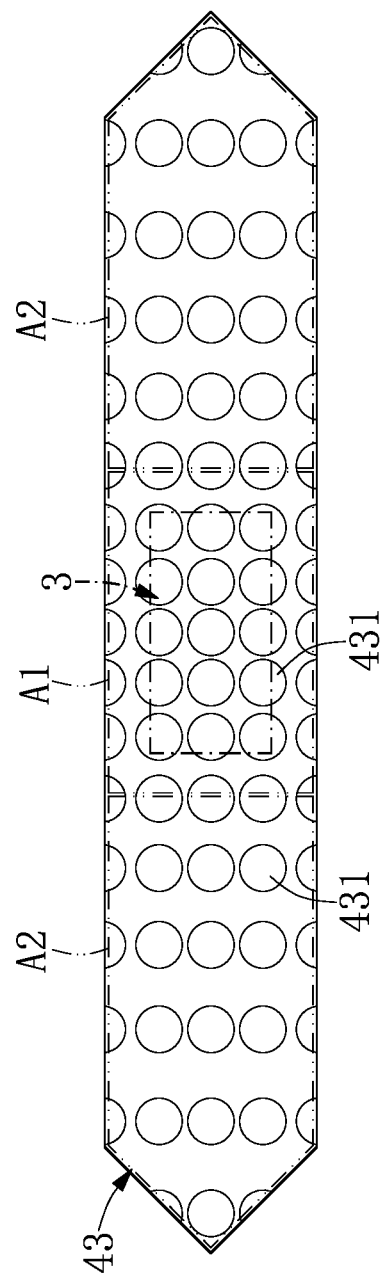
FIG. 8 is a schematic top view of a diffusion film of the display device according to the second embodiment of the present disclosure.

Referring to FIG. 6 to FIG. 8, the present embodiment is similar to the first embodiment, and the similarities between the present embodiment and the first embodiment will not be repeated herein. The differences between the present embodiment and the first embodiment are as follows.

Referring to FIG. 6 and FIG. 7, the base layer 41' of the diffusion film 4 in the present embodiment includes a transmissive substrate 411 and a diffusion coating layer 412 that is arranged on a side surface of the transmissive substrate 411 facing the reflective housing 2, and the diffusion coating layer 412 corresponds in position to the recesses 22. The pattern layer 42 is located on the side surface of the transmissive substrate 411 facing the reflective housing 2, and the shading region 422 surrounds the diffusion coating layer 412, that is, the diffusion coating layer 412 is located in the predetermined pattern region. The ink layer 43 is disposed on the diffusion coating layer 412, and the adhesive layer 44 is disposed on the paint on the shading region 422 of the pattern layer 42.

In other words, the base layer 41' in the present embodiment replaces the base layer 41 that includes the diffusive substrate in the first embodiment through the transmissive substrate 411 and the diffusion coating layer 412.

In addition, referring to FIG. 8, any two of the bottom areas of the ink spots 431 of the ink layer 43 are approximately equal, and a distance between any two of the ink spots 431 in the second region A2 is greater than a distance between any two of the ink spots 431 in the first region A1. In other words, in any one of the recesses 22, a distribution density of the ink spots 431 in the first region A1 is greater than a distribution density of the ink spots 431 in the second region A2, so that a total area of the bottom areas of the ink spots 431 in the first region A1 covers a range from 50% to 80% of an area of the first region A1 and a total area of the bottom areas of the ink spots 431 in the second region A2 covers a range from 20% to 50% of an area of the second region A2. Further, in each of the recesses 22, a difference between a transmittance in the first region A1 and a transmittance in the second region A2 can be within a range from 27% to 32% so as to reduce a difference between a luminous flux of the light generated by the light emitting diode units 3 in the first region A1 and a luminous flux of light generated by the light emitting diode units 3 in the second region A2 to obtain better light uniformity.

Third Embodiment

Figure 9:
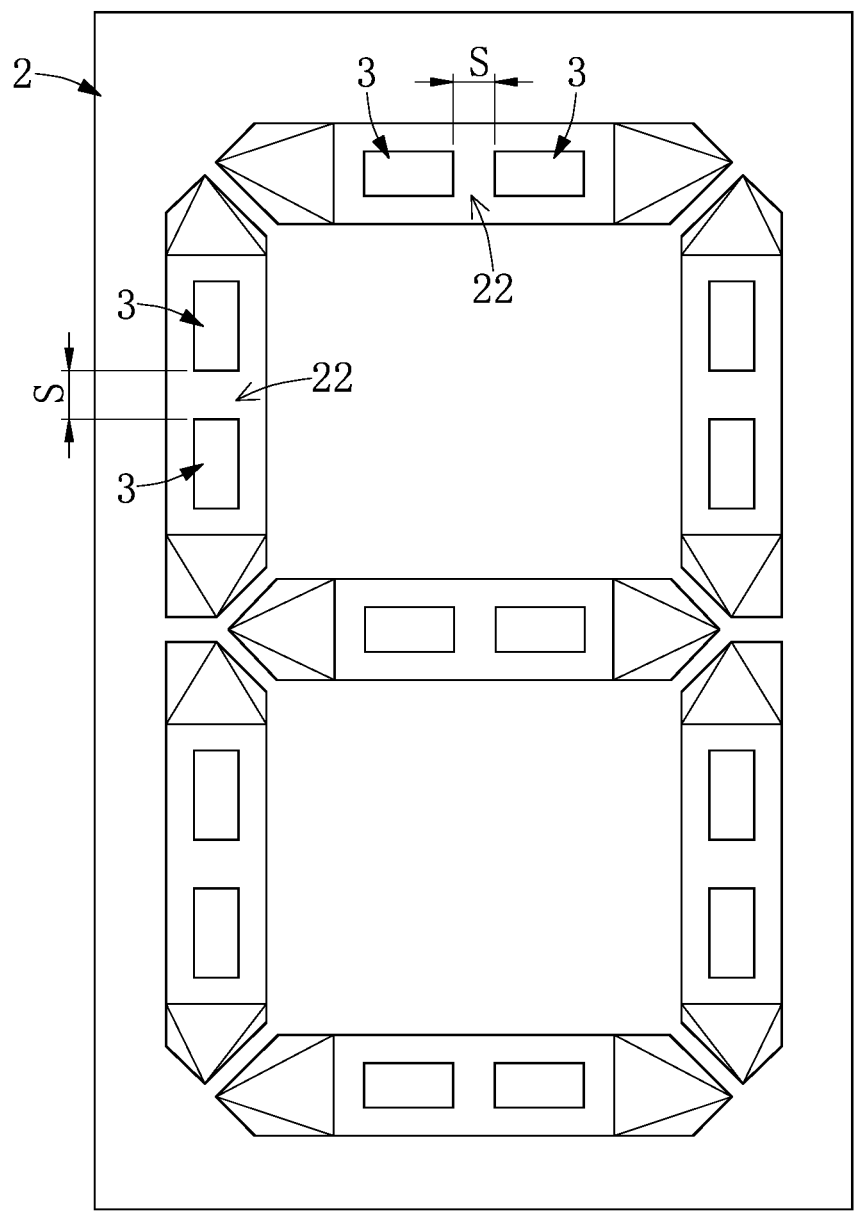
FIG. 9 is a schematic top view of a display device without a diffusion film according to a third embodiment of the present disclosure.

Referring to FIG. 9, the present embodiment is similar to the first embodiment, and the similarities between the present embodiment and the first embodiment will not be repeated herein. The differences between the present embodiment and the first embodiment are as follows.

Each of the recesses 22 in the present embodiment has a plurality of the light emitting diode units 3 disposed therein. In any one of the recesses 22, any two of the light emitting diode units 3 adjacent to each other are spaced apart from each other by a pre-determined distance S that is at least 3.57 millimeters (mm), so that a smallest quantity of the light emitting diode units 3 in any one of the recesses 22 can be used while still providing enough light source.

In addition, the display device 100 of the present embodiment can effectively improve the light uniformity through cooperating with the diffusion film 4 of the first embodiment or the second embodiment so as to prevent the light pattern on the diffusion film 4 from having uneven light distribution. It should be noted that for the convenience of description, the diffusion film 4 is not shown in the display device 100 in FIG. 9.

Fourth Embodiment

Figure 10:
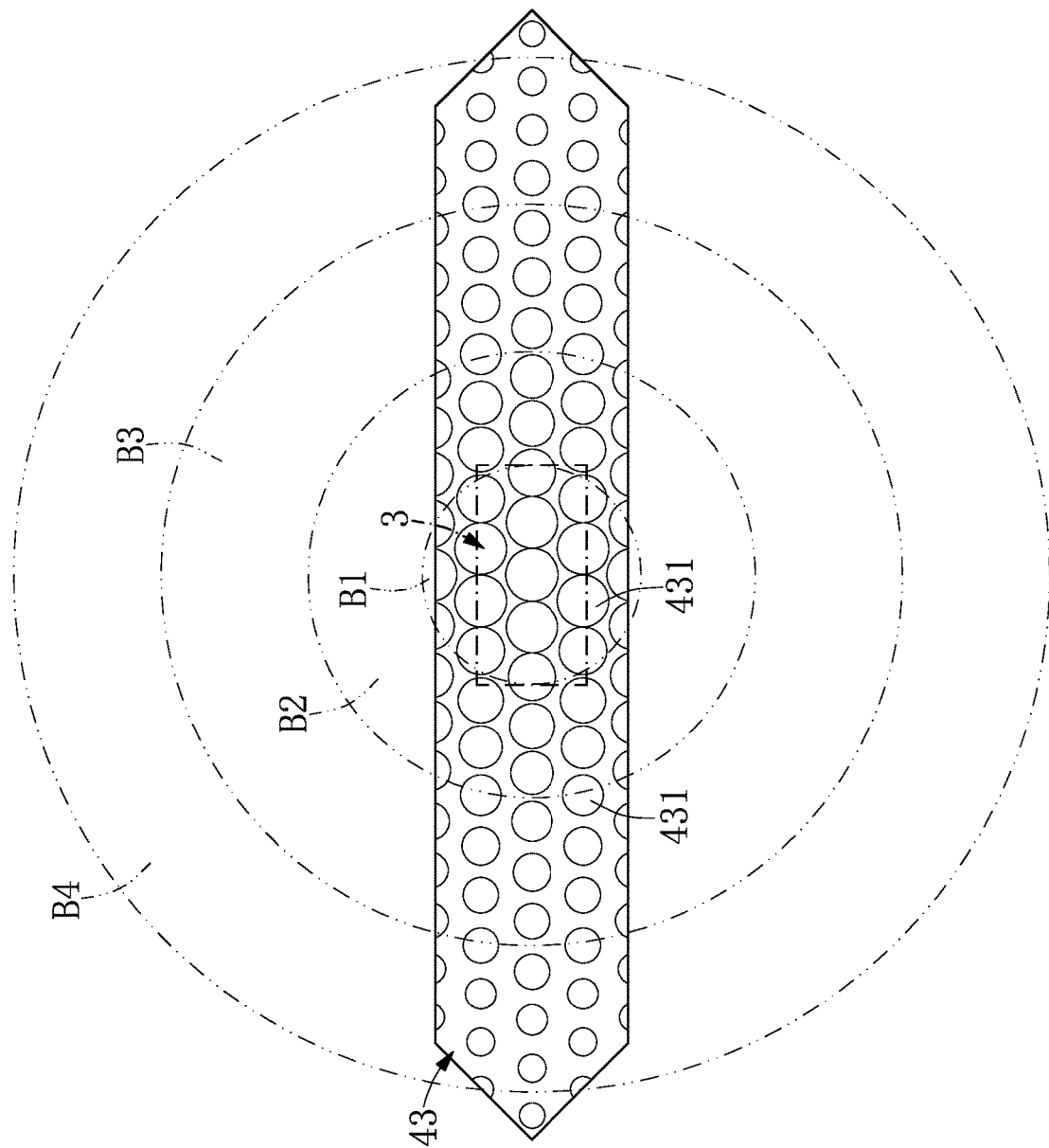
FIG. 10 is a schematic top view of a diffusion film of a display device according to a fourth embodiment of the present disclosure.

Referring to FIG. 10, the present embodiment is similar to the first embodiment, and the similarities between the present embodiment and the first embodiment will not be repeated herein. The differences between the present embodiment and the first embodiment are as follows.

A projection region of any one of the light emitting diode units 3 orthogonally projecting onto the diffusion film 4 is defined as one of a plurality of first regions B1 that is in a partial circular shape. The diffusion film 4 defines as a plurality of second regions B2 respectively surrounding any one of the first regions B1, a plurality of third regions B3 respectively surrounding any one of the second regions B2, and a plurality of fourth regions B4 that respectively surround any one of the third regions B3. In detail, in each of the recesses 22, the second region B2, the third region B3, and the fourth region B4 are ring-shaped, and a center of circle of the second region B2, the third region B3, and the fourth region B4 are overlapped with a center of circle of the first region B1.

In addition, in each of the recesses 22, a bottom area of each of the ink spots 431 located in the first region B1 is greater than a bottom area of each of the ink spots 431 located in the second region B2, the bottom area of each of the ink spots 431 located in the second region B2 is greater than a bottom area of each of the ink spots 431 located in the third region B3, and the bottom area of each of the ink spots 431 located in the third region B3 is greater than a bottom area of each of the ink spots 431 located in the fourth region B4.

Furthermore, in any one of the first regions B1, a total area of the bottom areas of the ink spots 431 covers a range from 60% to 80% of the area of the first region B1. In any one of the second regions B2, a total area of the bottom areas of the ink spots 431 covers a range from 40% to 60% of the area of the second region B2. In any one of the third regions B3, a total area of the bottom areas of the ink spots 431 covers a range from 20% to 40% of the area of the third region B3. In any one of the fourth regions B4, a total area of the bottom areas of the ink spots 431 covers a range from 0% to 20% of the area of the fourth region B4.

It is worth noting that the bottom areas of the ink spots 431 in each of the regions of the diffusion film 4 in the present embodiment can gradually and sequentially decrease from the first region B1 to the second region B2, the third region B3, and the fourth region B4 like the first embodiment, or the distribution density of the ink spots 431 in each of the regions of the diffusion film 4 can gradually and sequentially increase from the first region B1 to the second region B2, the third region B3, and the fourth region B4 like the second embodiment. As a result, the ink spots 431 that are located in the first region B1, the second region B2, the third region B3, and the fourth region B4 undergo changes in the area ratio as described above.

Beneficial Effects of Embodiments

In conclusion, by virtue of "the light generated by the light emitting diode units 3 disposed in each of the recesses 22 can be scattered through passing the ink spots 431 of the diffusion film 4, so that the difference in transmittance between the light passing through the first region A1 and the light passing through the second region A2 is reduced", the light pattern of the display device 100 in the present disclosure is formed by the light emitting diode units 3 being disposed in each of the recesses 22 on the diffusion film 4 and can prevent uneven light distribution.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A display device, comprising:
   a circuit board;
   a reflective housing disposed on the circuit board and having a plurality of recesses;
   a plurality of light emitting diode units disposed in the recesses and electrically connected to the circuit board; and
   a diffusion film disposed on the reflective housing and covering the recesses, wherein the diffusion film includes a plurality of ink spots, and the ink spots correspond in position to the recesses, wherein each of the recesses is completely enclosed by the diffusion film, the reflective housing, and the circuit board.

2. The display device according to claim 1, wherein the diffusion film further includes:
   a base layer;
   a pattern layer disposed on the base layer, wherein the pattern layer has a plurality of predetermined pattern regions that allow light to pass therethrough, and wherein the predetermined pattern regions respectively correspond in position to the recesses;
   an ink layer disposed on the base layer, wherein the ink layer has the ink spots that correspond in position to the predetermined pattern regions; and
   an adhesive layer disposed on the pattern layer, wherein the adhesive layer is configured to fix the diffusion film on the reflective housing.

3. The display device according to claim 2, wherein the pattern layer further includes a shading region, and the shading region surrounds and forms the predetermined pattern regions.

4. The display device according to claim 2, wherein the base layer includes a transmissive substrate and a diffusion coating layer that is disposed on the transmissive substrate, and wherein the diffusion coating layer corresponds in position to the recesses.

5. The display device according to claim 2, wherein the base layer is a diffusive substrate.

6. The display device according to claim 1, wherein a color of each of the ink spots is white.

7. The display device according to claim 1, wherein a projection region of any one of the light emitting diode units orthogonally projecting onto the diffusion film is defined as one of a plurality of first regions, and the diffusion film defines a plurality of second regions that respectively surround any one of the first regions, wherein the ink spots are respectively located at the first regions and the second regions, and a distance between any two of the ink spots in the second region is greater than a distance between any two of the ink spots in the first region, and wherein any two of bottom areas of the ink spots are equal to each other.

8. The display device according to claim 7, wherein, in any one of the first regions, a total area of the bottom areas of the ink spots covers a range from 50% to 80% of an area of the first region, and wherein, in any one of the second regions, a total area of the bottom areas of the ink spots covers a range from 20% to 50% of an area of the second region.

9. The display device according to claim 7, wherein, in each of the recesses, a difference between a transmittance in the first region and a transmittance in the second region each are within a range from 27% to 32%.

10. The display device according to claim 1, wherein each of the ink spots is in a shape of a dot.

11. The display device according to claim 1, wherein a projection region of any one of the light emitting diode units orthogonally projecting onto the diffusion film is defined as one of a plurality of first regions, wherein the diffusion film defines a plurality of second regions respectively surrounding any one of the first regions, a plurality of third regions respectively surrounding any one of the second regions, and a plurality of fourth regions that respectively surround any one of the third regions, wherein a bottom area of each of the ink spots located in the first regions is greater than a bottom area of each of the ink spots located in the second regions, the bottom area of each of the ink spots located in the second regions is greater than a bottom area of each of the ink spots located in the third regions, and the bottom area of each of the ink spots located in the third regions is greater than a bottom area of each of the ink spots located in the fourth regions.

12. The display device according to claim 11, wherein, in any one of the first regions, a total area of the bottom areas of the ink spots covers a range from 60% to 80% of an area of the first region, wherein, in any one of the second regions, a total area of the bottom areas of the ink spots covers a range from 40% to 60% of an area of the second region, wherein, in any one of the third regions, a total area of the bottom areas of the ink spots covers a range from 20% to 40% of an area of the third region, and wherein, in any one of the fourth regions, a total area of the bottom areas of the ink spots covers a range from 0% to 20% of an area of the fourth region.

13. The display device according to claim 1, wherein the ink spots are spaced apart from each other.

14. The display device according to claim 13, wherein a projection region of any one of the light emitting diode units orthogonally projecting onto the diffusion film is defined as one of a plurality of first regions, and the diffusion film defines a plurality of second regions that respectively surround any one of the first regions, wherein the ink spots are respectively located at the first regions and the second regions, and a bottom area of each of the ink spots located in any one of the first regions is greater than a bottom area of each of the ink spots located in any one of the second regions, and wherein any two of the ink spots adjacent to each other are equidistantly spaced apart from each other.

15. The display device according to claim 14, wherein, in any one of the first regions, a total area of the bottom areas of the ink spots covers a range from 50% to 80% of an area of the first region, and wherein, in any one of the second regions, a total area of the bottom areas of the ink spots covers a range from 20% to 50% of an area of the second region.

16. The display device according to claim 14, wherein, in each of the recesses, a difference between a transmittance in the first region and a transmittance in the second region is within a range from 27% to 32%.

* * * * *